(12) United States Patent
Sung et al.

(10) Patent No.: US 6,347,026 B1
(45) Date of Patent: *Feb. 12, 2002

(54) INPUT AND POWER PROTECTION CIRCUIT IMPLEMENTED IN A COMPLEMENTARY METAL OXIDE SEMICONDUCTOR PROCESS USING SALICIDES

(75) Inventors: Roberto Sung, Cupertino; Jau-Wen Chen, Santa Clara, both of CA (US)

(73) Assignee: LSI Logic Corporation, Milpitas, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/320,013

(22) Filed: May 26, 1999

(51) Int. Cl.[7] ................................................. H02H 9/00

(52) U.S. Cl. .......................................... 361/56; 361/111

(58) Field of Search ................................ 257/355, 360; 361/54, 56, 111; 327/306, 309, 310

(56) References Cited

U.S. PATENT DOCUMENTS

| | | | | |
|---|---|---|---|---|
| 4,495,512 A | * | 1/1985 | Isaac et al. | 357/34 |
| 4,874,717 A | * | 10/1989 | Neppl et al. | 437/59 |
| 4,965,216 A | * | 10/1990 | Scovell et al. | 437/31 |
| 4,996,626 A | | 2/1991 | Say | |
| 5,140,401 A | | 8/1992 | Ker et al. | |
| 5,182,220 A | | 1/1993 | Ker et al. | |
| 5,392,185 A | | 2/1995 | Haas et al. | |
| 5,537,284 A | | 7/1996 | Hass et al. | |
| 5,545,909 A | | 8/1996 | Williams et al. | |

(List continued on next page.)

FOREIGN PATENT DOCUMENTS

| | | |
|---|---|---|
| EP | 0 735 640 A1 | 10/1996 |
| EP | 0 845 848 A2 | 6/1998 |

OTHER PUBLICATIONS

Timothy J. Maloney et al., "Novel Clamp Circuits For IC Power Supply Protection", EOS/ESD Symposium 95, pp. 1.1.1–1.1.12 (1995).

(List continued on next page.)

*Primary Examiner*—Kim Huynh
(74) *Attorney, Agent, or Firm*—Luedeka, Neely & Graham

(57) ABSTRACT

Fabricated using a complementary metal oxide semiconductor process including the use of salicides, an input and power protection circuit for use in an integrated circuit protects voltage and signal terminals from both overvoltage and ESD pulses. A diode connected is connected between a first terminal and an inter-transistor node, a field effect transistor is connected between the inter-transistor node and a second terminal, and a lateral bipolar transistor, with a base connected to the inter-transistor node, is connected between the first and the second terminals. When an ESD pulse appears on the first terminal, the voltage at the inter-transistor node increases until a snapback trigger voltage of the field effect transistor is reached whereupon current flows from the first terminal, through the emitter-base junction of the lateral bipolar transistor, through the inter-transistor node, through the field effect transistor, and to the second terminal. In response to the current flow through the inter-transistor node, the lateral bipolar transistor substantially increases the current flow from the first terminal, through the lateral bipolar transistor, and to the second terminal so that a majority of current will flow through this path. Similarly, when an ESD pulse appears on the second terminal, this creates current flow from the second terminal, through the collector-base junction of the lateral bipolar transistor, through the inter-transistor node, through the diode, and to the first terminal.

6 Claims, 7 Drawing Sheets

U.S. PATENT DOCUMENTS

| | | | |
|---|---|---|---|
| 5,637,900 A | * | 6/1997 | Ker et al. .................. 257/355 |
| 5,644,459 A | | 7/1997 | Lien |
| 5,644,460 A | | 7/1997 | Clukey |
| 5,654,574 A | | 8/1997 | Williams et al. |
| 5,677,205 A | | 10/1997 | Williams et al. |
| 5,740,000 A | * | 4/1998 | Stackhouse et al. .......... 361/56 |
| 5,774,318 A | | 6/1998 | McClure et al. |
| 5,808,342 A | | 9/1998 | Chen et al. |
| 5,825,600 A | | 10/1998 | Watt |
| 5,946,175 A | * | 8/1999 | Yu .............................. 361/56 |
| 5,978,192 A | * | 11/1999 | Young et al. ................. 361/56 |

OTHER PUBLICATIONS

Steven H. Voldman et al., "Analysis Of Snubber–Clamped Diode–String Mixed Voltage Interface ESD Protection Network For Advanced Microprocessors", EOS/ESD Symposium 95, pp. 1.6.1–1.6.19 (1995).

Ajith Amerasekera et al., "Substrate Triggering and Salicide Effects On ESD Performance And Protection Circuit Design In Deep Submicron CMOS Processes", IEEE, IEDM 95–547, pp. 547–550 (1995).

Robert N. Rountree, "ESD Protection For Submicron CMOS Circuits Issues and Solutions", IEDM 88, IEEE, pp. 580–583 (1988).

B. Jayant Baliga, Power Semiconductor Devices, PWS Publishing Company, ISBN:0–534–94098–6, Chapter 8, Boston, MA (1995).

Stephen G. Beebe, "Characterization, Modeling And Design Of ESD Protection Circuits", Technical Report No. ICL 98–083, Integrated Circuits Laboratory, Department of Electrical Engineering, Stanford University, pp. 1–53 (1998).

* cited by examiner

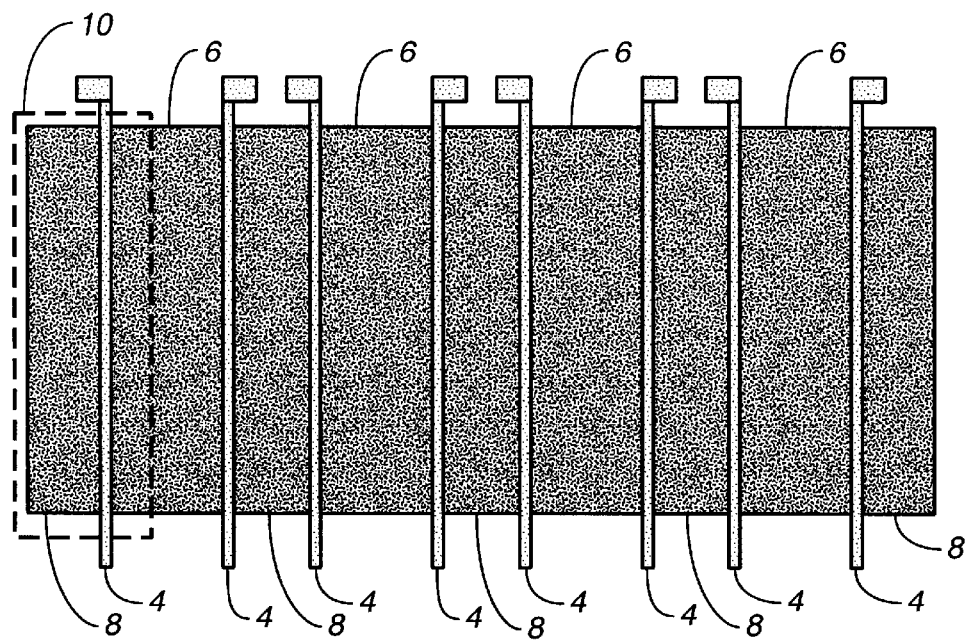
FIG._1A *(PRIOR ART)*
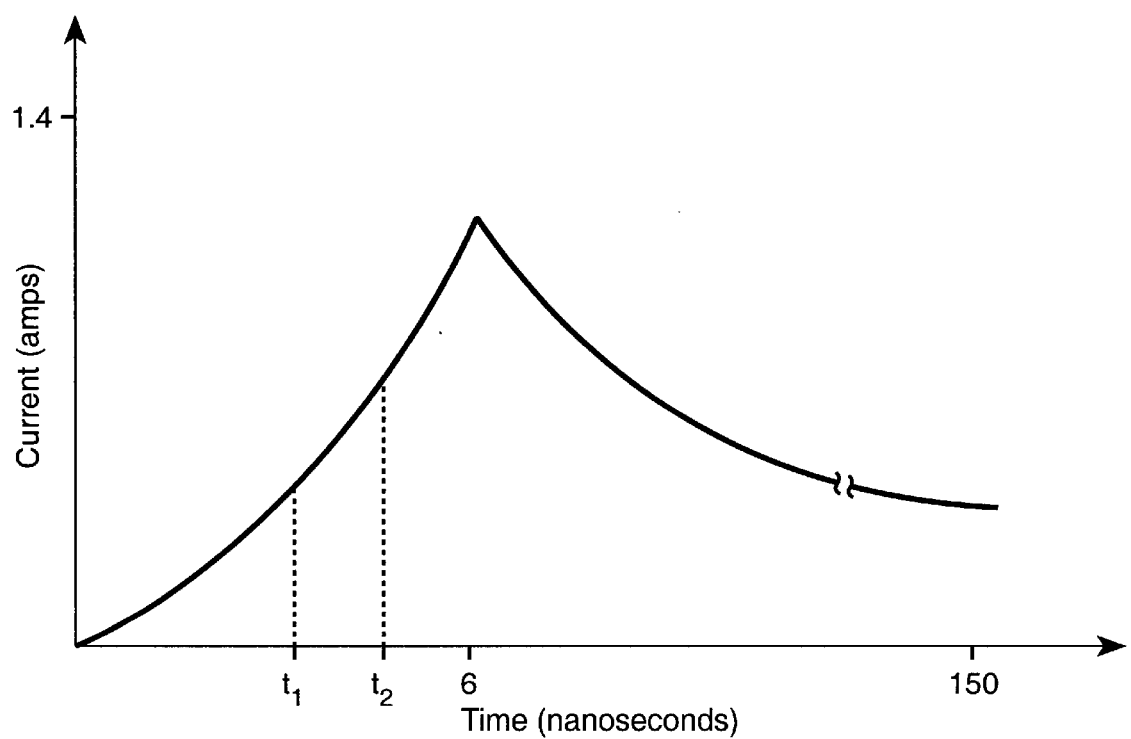
FIG._1B

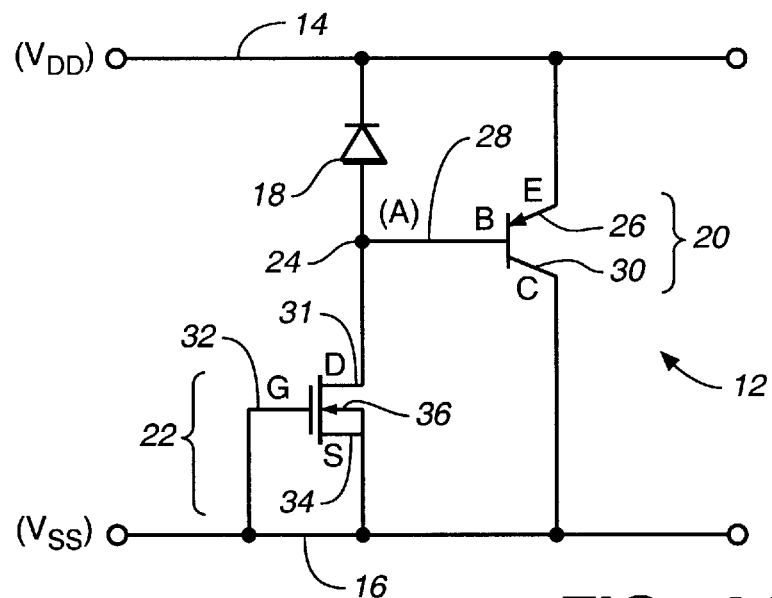
FIG._2A
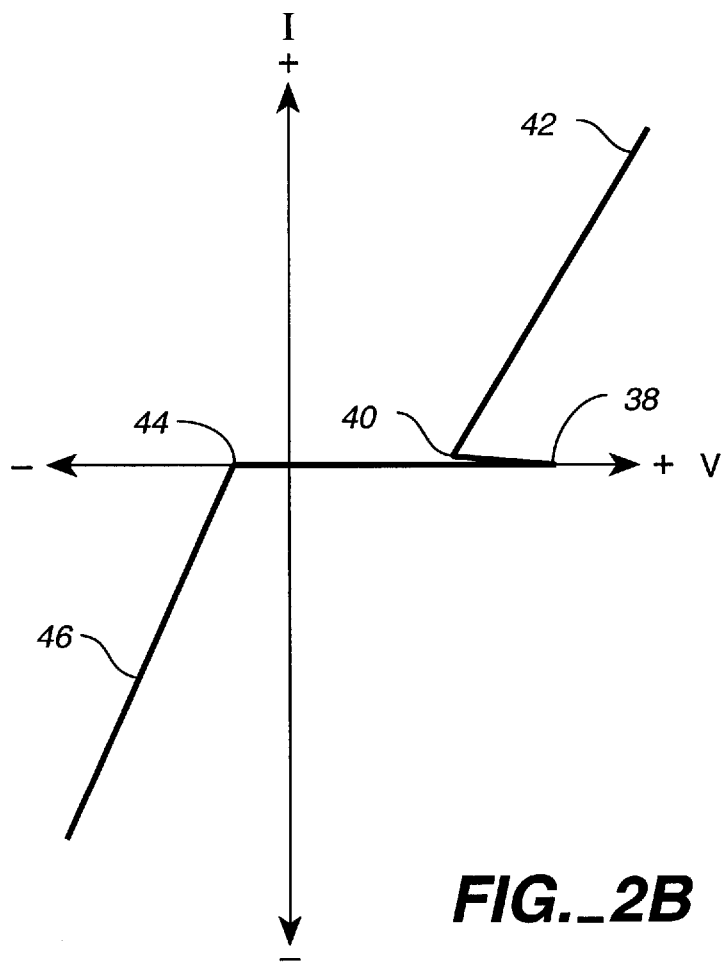
FIG._2B

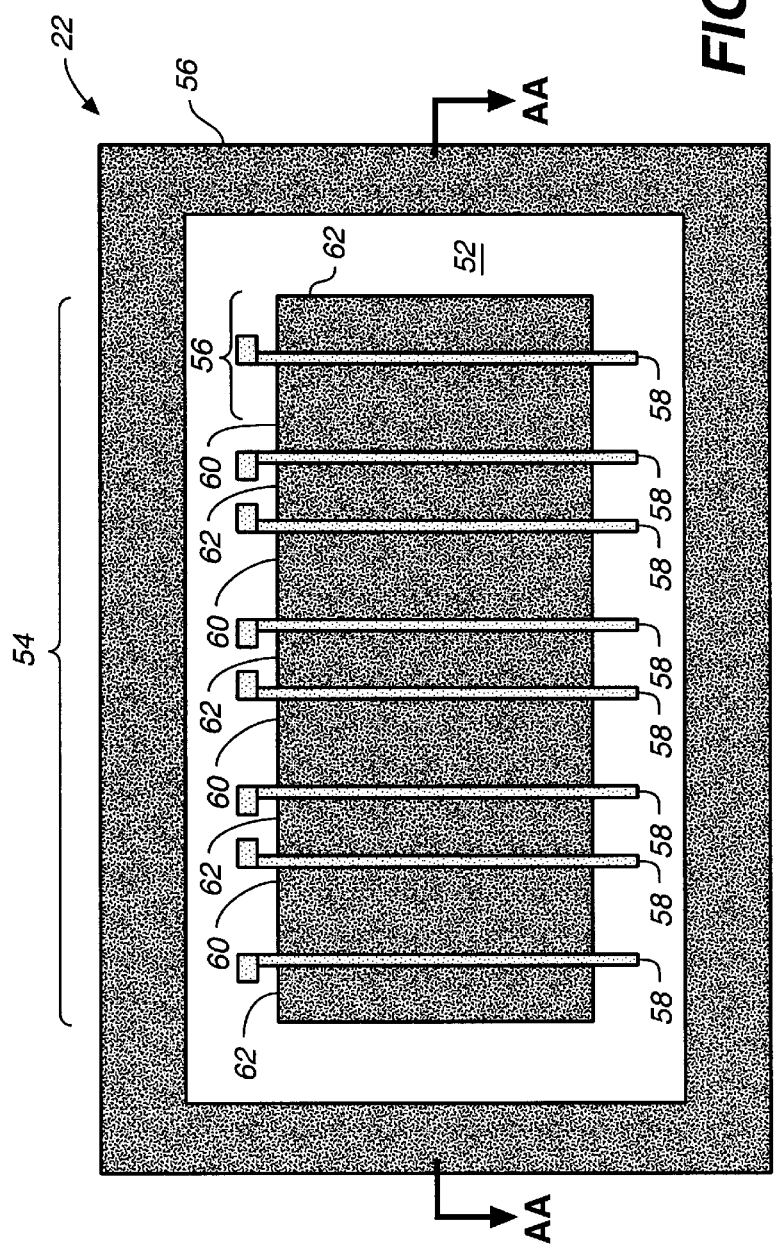
FIG._3A
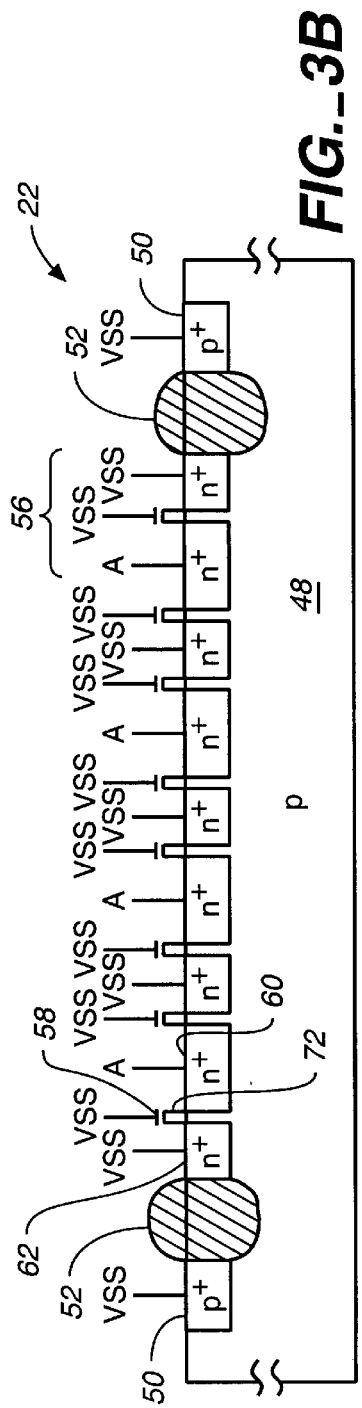
FIG._3B

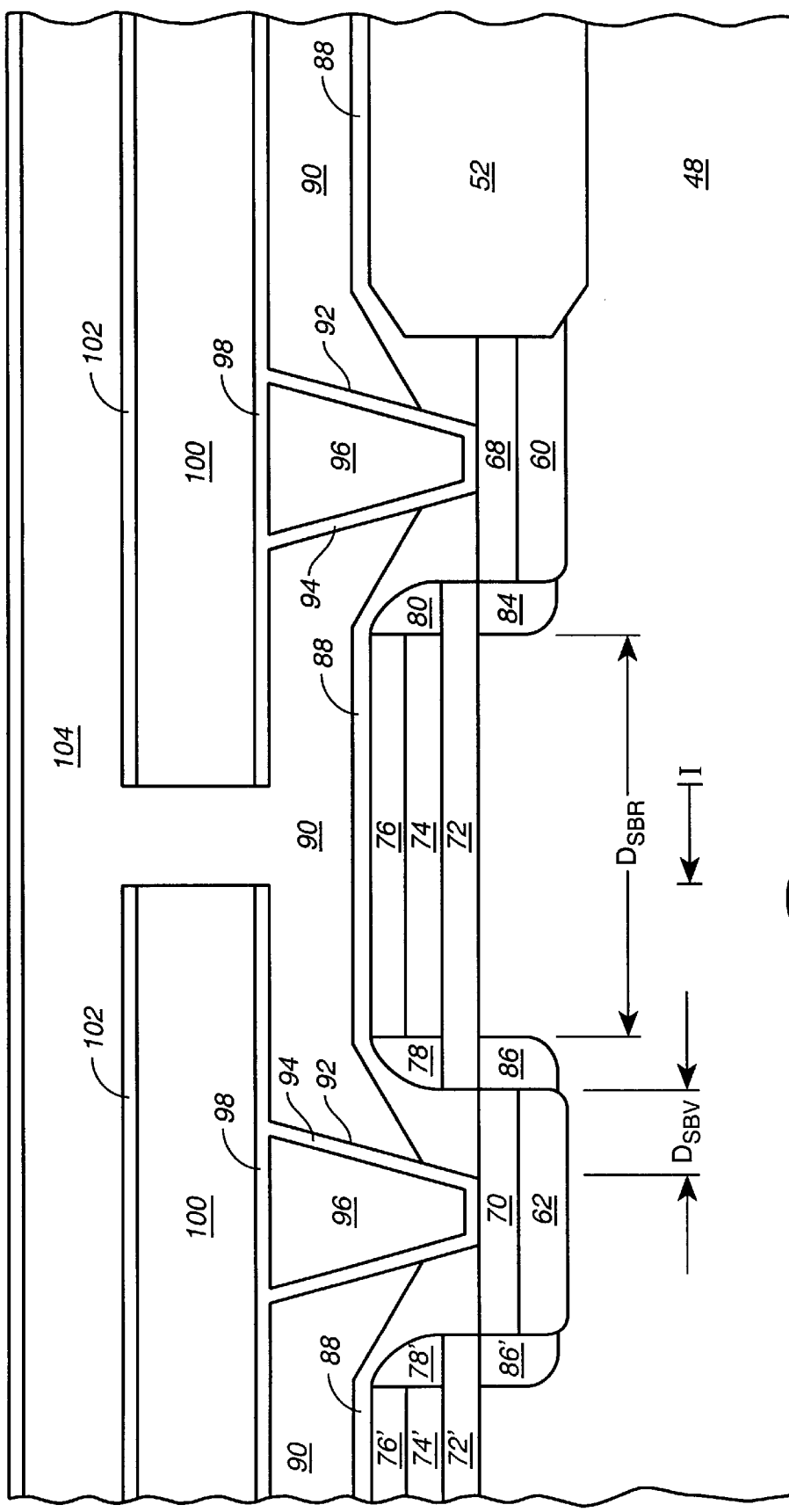
FIG._3C

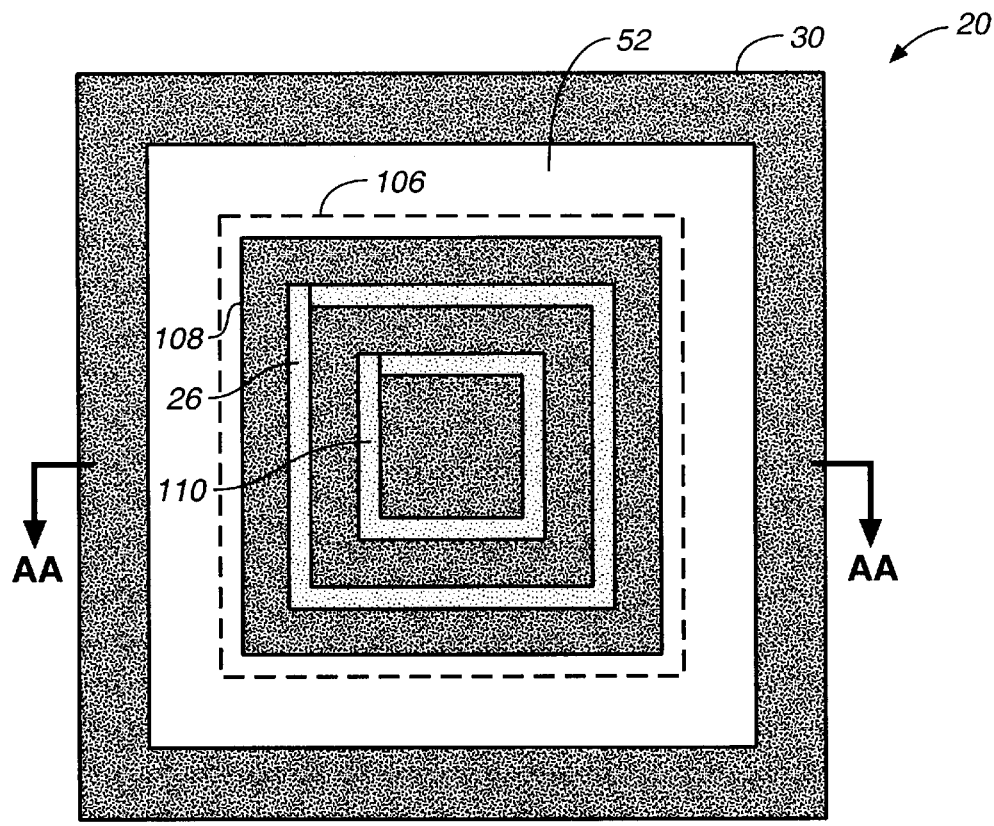
FIG._4A
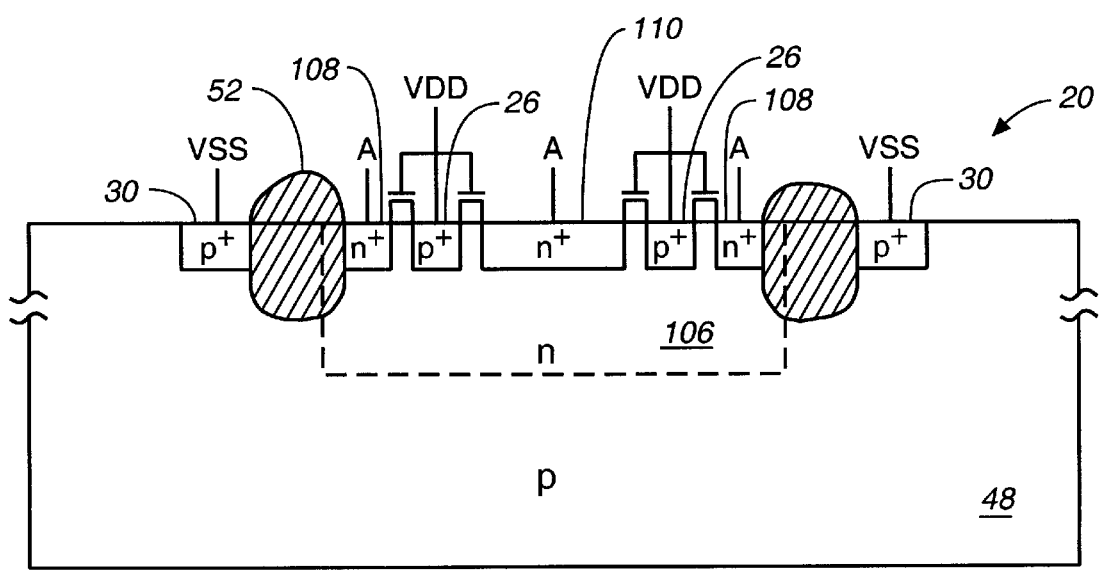
FIG._4B

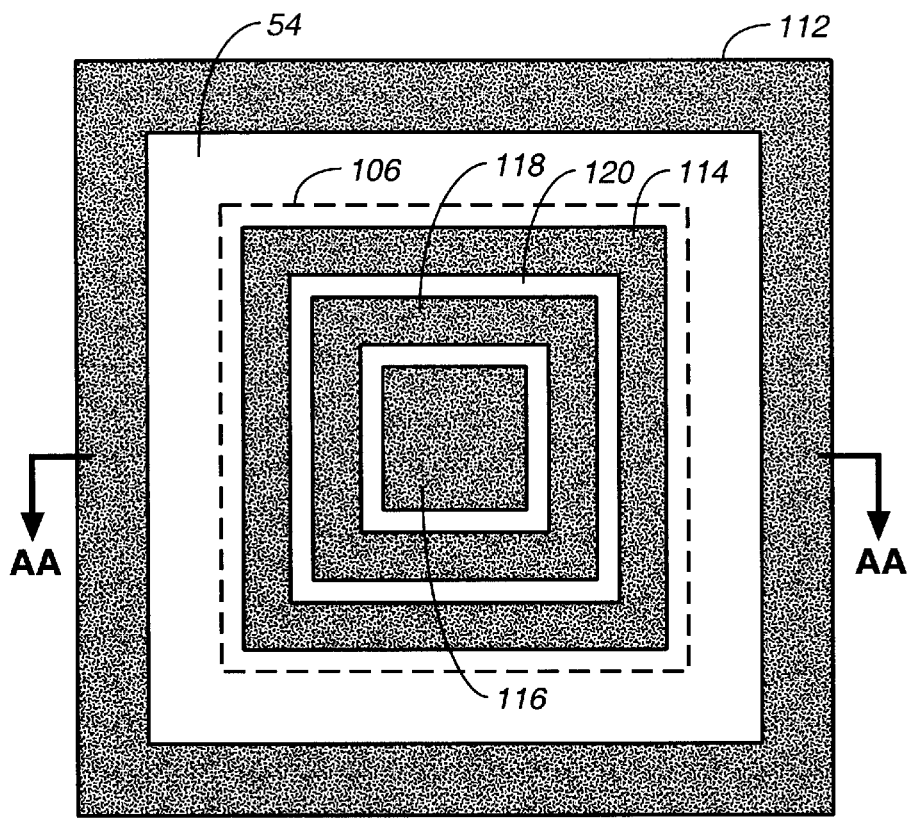
FIG._5A
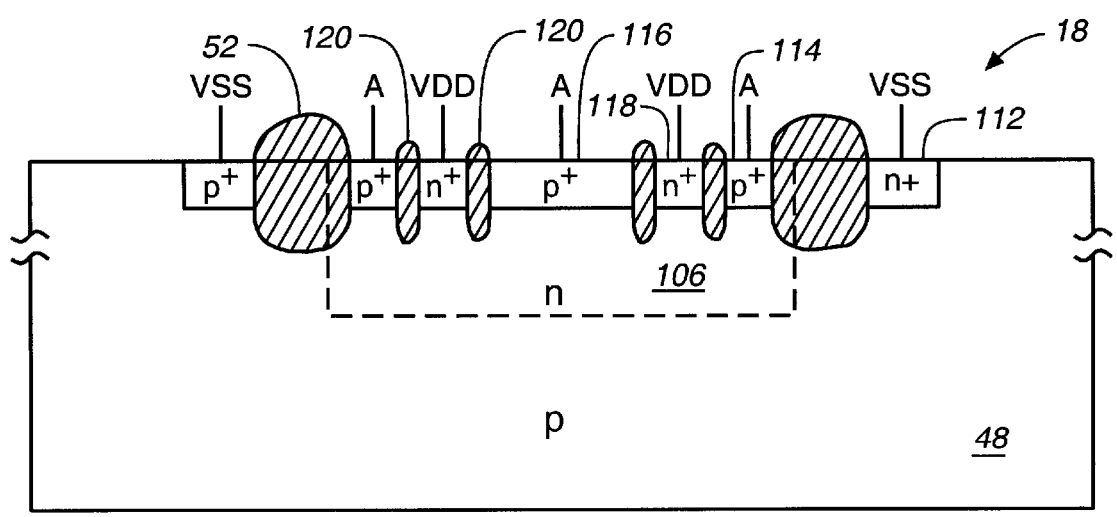
FIG._5B

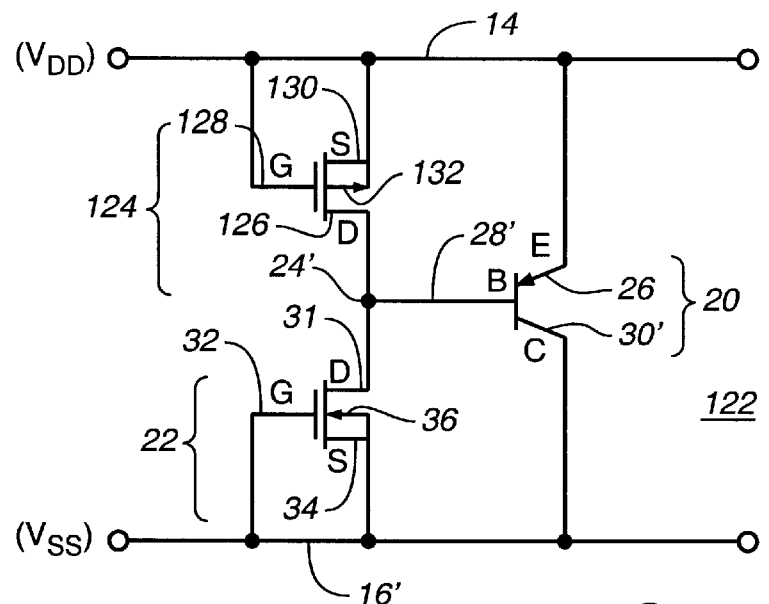
FIG._6A
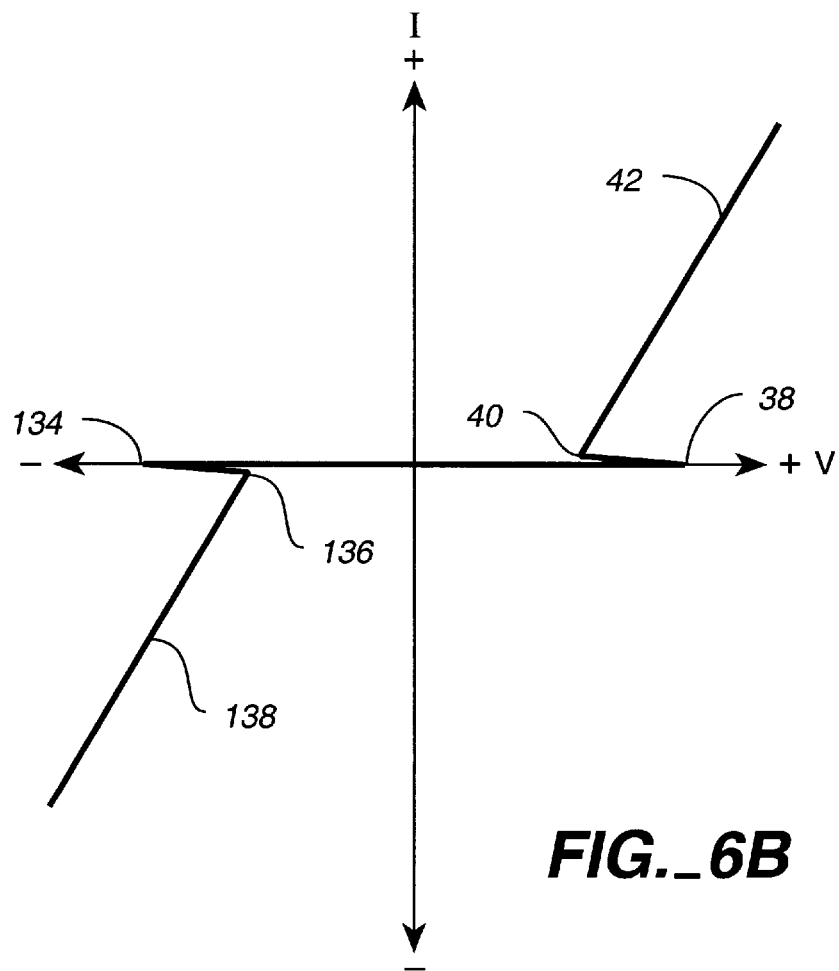
FIG._6B

INPUT AND POWER PROTECTION CIRCUIT IMPLEMENTED IN A COMPLEMENTARY METAL OXIDE SEMICONDUCTOR PROCESS USING SALICIDES

BACKGROUND OF THE INVENTION

1. Field of the Invention

This invention relates to the field of electrostatic discharge protection circuits for protecting voltage and signal terminals and particularly to input and power protection circuits implemented in a complementary metal oxide semiconductor process that uses salicides.

2. Description of the Related Art

An integrated circuit typically contains a numbers of electronic components that are highly susceptible to damage from either an electrostatic discharge, referred to as an ESD pulse, or an overvoltage condition. ESD pulses can subject an unprotected integrated circuit to voltages in excess of 1000 volts, in either a positive or a negative direction. ESD pulses or an overvoltage condition can occur on an integrated circuit's signal or power supply terminal and can cause catastrophic damage via either route. Some form of protection circuitry is usually provided in an integrated circuit to reduce the likelihood of damage due to either cause. Several industry standard characterization models have also been developed to test the ESD robustness of any such protection circuitry for an integrated circuit.

The industry standard characterization model most used to test the ESD robustness of the protection circuitry for an integrated circuit is the human-body model (hereinafter "HBM") which simulates the discharge from a human finger into a voltage or signal terminal. In this model, a capacitor is charged up to a certain voltage, known as the HBM voltage, and then discharged through a resistor into a signal terminal of the device under test with another terminal, typically a voltage terminal, tied to ground. In typical reliability testing, all the signal terminals of an integrated circuit are tested with respect to all power and ground terminals with both polarities of a given HBM voltage. In addition, signal terminals may be tested against other signal terminals and voltage terminals may be tested against ground terminals. Current leakage measurements at specified reverse voltages are then performed on the same set of terminals. If the HBM voltage applied to every terminal under test in the DUT is 2 kilovolts and the resulting leakage current of all terminals of the device under test is below a certain level, then the integrated circuit is said to be resistant to 2 kilovolts HBM.

For integrated circuits implemented solely using a standard complementary metal oxide semiconductor (hereinafter "CMOS") fabrication process, the current protection circuits struggle to provide adequate HBM protection. The current protection circuit is comprised of a single metal oxide semiconductor field effect transistor (hereinafter "MOSFET") and, when implemented between a voltage terminal and a ground terminal, has a drain connected to the voltage terminal and both a gate and a source connected to the ground terminal. Referring to FIG. 1A, a top view of such a prior art MOSFET is shown. The MOSFET 2 is comprised of a plurality of gate fingers 4, a plurality of drain regions 6, and a plurality of source regions 8. Each gate finger 4 and adjacent drain region 6 and adjacent source region 8 defines a mini MOSFET 10 and collectively all the mini MOSFETs make up the MOSFET 2. Although all the MOSFETs and hence mini MOSFETs are fabricated at the same time using the same standard CMOS fabrication process, variations exist and each mini MOSFET 10 has slightly different electrical characteristics.

When a HBM event of greater than 2 kilovolts is applied to the voltage terminal of the current generation of protection circuit, the MOSFET 2 must be able to safely handle approximately 1.4 amps for 150 nanoseconds in order to provide adequate protection. Such a HBM event is shown in FIG. 1B and, when applied to the plurality of drain regions 6, the voltage at the drain regions 6 increases until the lowest first snapback trigger current and voltage associated with one of the mini MOSFETs is reached. This event is shown as $t_1$ in FIG. 1B and, at this time, the mini MOSFET 10 with the lowest first snapback trigger voltage enters into avalanche breakdown and creates a path for current to flow from the voltage terminal, through the drain region 6, through the source region 8, and to the ground terminal. This reduces the voltage between the drain regions 6 and the source regions 8 to a level below that of the lowest first snapback trigger voltage which thereby keeps the remainder of the mini MOSFETs off. As time progresses, the current flow through and voltage between the one mini MOSFET defined above increases. Both the current flow through and the voltage between this one mini MOSFET increases until the second snapback trigger current and voltage associated with the mini MOSFET is reached. In FIG. 1B, this is shown as $t_2$. The magnitude of the second snapback trigger current is usually significantly higher than the magnitude of the first snapback trigger current while the magnitude of the second snapback trigger voltage is usually significantly less than the magnitude of the first snapback trigger voltage. Hence, the remainder of the mini MOSFETs still remain off. When time $t_2$ is reached, localized hot spots begin forming in the region of high joule heating in the one mini MOSFET defined above. However, as shown in FIG. 1B, the current flow through this one mini MOSFET continues to increase which increases the temperature at these localized hot spots to a level potentially above the silicon melting point thereby potentially causing thermal damage to this one mini MOSFET and ultimately either a short circuit or open circuit in the entire MOSFET which renders the entire input protection device inoperative.

For a much more detailed and complete discussion of several of the industry standard characterization models, including the HBM, along with MOSFETs as protection circuits, please refer the paper by Stephen G. Beebe entitled "Characterization, Modeling and Design of ESD Protection Circuits," March 1998, Technical Report No. ICL 98-083, Integrated Circuits Laboratory, Department of Electrical Engineering, Stanford University, Stanford, Calif. 94305, Pages 1–54, which is hereby incorporated by reference.

This problem is further exasperated for protection circuits which are solely implemented using a fully salicided CMOS fabrication process. Self aligned suicides or salicides, as the term is more commonly known, provide a number of advantageous characteristics including the reduction of the sheet resistance of the contact, the prevention of spiking between the metal interconnection and the source/drain junctions, and the formation of an $SiO_2$ insulating layer within the silicide layer. However, from the prospective of designing a protection circuit which can withstand HBM voltages greater than several kilovolts, the use of salicides provides a highly adverse effect. Simply stated, the second snapback trigger current associated with any MOSFET fabricated in any fully salicided CMOS fabrication process is significantly less than the magnitude of such a second snapback trigger current associated with the same MOSFET fabricated in a CMOS fabrication process without the use of salicides. This significant reduction in the second snapback trigger current significantly reduces the magnitude of the current which any mini MOSFET can safely dissipate without thermal damage. This, in turn, reduces the magnitude of the HBM voltage which any MOSFET input protection device can handle and hence degrades the performance of any MOSFET input protection device fabricated from a fully salicided CMOS fabrication process.

For a more detailed description of the effect that salicides have on ESD performance of protection circuits, please refer to the paper by Ajith Amerasekera et al., entitled "Substrate Triggering and Salicide Effects on ESD Performance and Protection Circuit Design in Deep Submicron CMOS Processes," IEDM (1995), Pages 547–550, which is hereby incorporated by reference.

A need thus exists for a protection circuit for use in an integrated circuit that is easily implemented using a fully salicided CMOS fabrication processing, that protects voltage and signal terminals from overvoltage conditions and ESD pulses, and that provides greater than several kilovolts HBM protection.

SUMMARY OF THE INVENTION

An input and power protection circuit for use in an integrated circuit is presented which satisfies these needs. The input and power protection circuit is effective for overvoltage and ESD pulses, protects both voltage and signal terminals, is implemented in a fully salicided CMOS fabrication process, and requires no additional processing steps to implement.

A first embodiment of the input and power protection circuit includes a diode connected between a first terminal and an inter-transistor node, a bipolar transistor connected between the first terminal and a second terminal and having a base connected to the inter-transistor node, and a field effect transistor connected between the inter-transistor node and the second terminal. When a positive ESD pulse appears on the first terminal, the voltage at the inter-transistor node increases until the snapback trigger voltage of the field effect transistor is reached. This causes current flow from the first terminal, through the emitter-base junction of the bipolar transistor, through the inter-transistor node, through the field effect transistor, and to the second terminal. As increased current flows through the above-identified path, the bipolar transistor amplifies the increased current flow through the inter-transistor node and substantially increases the flow of current from the first terminal, through the bipolar transistor, and to the second terminal so that a majority of current flows through this path. Similarly, when a negative ESD pulse appears on the second terminal, this creates a current flow from the second terminal, through the collector-base junction of the bipolar transistor, through the inter-transistor node, through the diode, and to the first terminal.

A second embodiment of the input and power protection circuit includes a first field effect transistor connected between a first terminal and an inter-transistor node, a bipolar transistor connected between the first terminal and a second terminal and having a base connected to the inter-transistor node, and a second field effect transistor connected between the inter-transistor node and the second terminal. When a positive ESD pulse appears on the first terminal, the voltage at the inter-transistor node increases until the snapback trigger voltage of the second field effect transistor is reached. This causes current flow from the first terminal, through the emitter-base junction of the bipolar transistor, through the inter-transistor node, through the second field effect transistor, and to the second terminal. As increased current flows through the above-identified path, the bipolar transistor amplifies the increased current flow through the inter-transistor node and substantially increases the flow of current from the first terminal, through the bipolar transistor, and to the second terminal so that a majority of current flows through this path. Similarly, when a negative ESD pulse appears on the second terminal, the voltage at the inter-transistor node increases until the snapback trigger voltage of the first field effect transistor is reached. This causes current flow from the second terminal, through the collector-base junction of the bipolar transistor, through the inter-transistor node, through the first transistor, and to the first terminal.

BRIEF DESCRIPTION OF THE DRAWINGS

Other objects and advantages of the invention will become apparent upon reading the following detailed description and upon reference to the accompanying drawings in which:

FIG. 1A is a top view of a prior art ESD protection circuit.

FIG. 1B is a diagrammatic illustration of the current and time characteristics for the human body model which tests the robustness of ESD protection circuitry.

FIG. 2A is a schematic diagram of a first embodiment of an input and power protection circuit according to the present invention.

FIG. 2B is a diagrammatic illustration of the current and voltage characteristics of the input and power protection circuit shown in FIG. 2A.

FIG. 3A is an illustration of the top view of the MOSFET shown in FIG. 2A.

FIG. 3B is an illustration of a cross-sectional view of the MOSFET taken along line AA—AA in FIG. 3A.

FIG. 3C is an illustration of a cross-sectional view of one of the mini-MOSFET shown in FIG. 3B.

FIG. 4A is an illustration of the top view of the bipolar transistor shown in FIG. 2A.

FIG. 4B is an illustration of a cross-sectional view of the bipolar transistor taken along line AA—AA in FIG. 4A.

FIG. 5A is an illustration of the top view of the diode shown in FIG. 2A.

FIG. 5B is an illustration of a cross-sectional view of the diode taken along line AA—AA in FIG. 5A.

FIG. 6A is a schematic diagram of a second embodiment of an input and power protection circuit according to the present invention.

FIG. 6B is a diagrammatic illustration of the current and voltage characteristics of the input and power protection circuit shown in FIG. 6A.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

The present invention provides a novel input and power protection circuit which protects integrated circuits from overvoltage and ESD pulses, protects both voltage and signal terminals, is implemented in a standard CMOS fabrication process which uses salicides, and requires no additional processing steps to implement. The invention is best understood by reference to the accompanying drawings in which like elements are designated with like numerals.

A first preferred embodiment of a novel input and power protection circuit 12 is shown in FIG. 2A. In FIG. 2A, the input and power protection circuit 12 provides protection to both a voltage terminal 14 and a ground terminal 16. The input and power protection circuit 12 includes a diode 18, a bipolar transistor 20, and a MOSFET 22. A "diode" refers to any device which does not conduct current when the voltage drop across it is less than a particular threshold and does conduct current when the threshold is exceeded, such as in the case of a conventional diode or a diode-connected transistor. The diode 18 is connected between the voltage terminal 14 and an inter-transistor node 24. The bipolar transistor 20 includes an emitter 26 connected to the voltage terminal 14, a base 28 connected to the inter-transistor node 24, and a collector 30 connected to the ground terminal 16. As shown in FIG. 2A, the bipolar transistor 20 is a PNP type transistor. The MOSFET 22 includes a drain 31 connected to the inter-transistor node 24, a gate 32 connected to the ground terminal 16, a source 34 connected to the ground terminal 16, and a substrate terminal 36 connected to the ground terminal 16. As shown in FIG. 2A, the MOSFET 22 is a N-type MOSFET. The MOSFET 22 is fabricated such that a first snapback trigger voltage (hereinafter "snapback trigger voltage") and a snapback holding voltage associated with the MOSFET 22 is higher than the magnitude of the positive nominal operating voltage associated with voltage terminal 14. Please note that, as shown in FIG. 2A, the voltage terminal 14 can be referred to as $V_{DD}$, the ground terminal 16 can be referred to as $V_{SS}$, and the inter-transistor node 24 as A. This notation will be particularly useful below when explaining the details of FIGS. 3, 4, and 5.

Under normal operating conditions, the voltage terminal 14 is biased to a nominal operating voltage, typically either 1.8, 2.5, or 3.3 volts, which keeps both the MOSFET 22 and the bipolar transistor 20 in the "off" condition. With the MOSFET 22 off, only a small drain leakage current passes through the MOSFET 22, typically in the range of less than 1 nano-amp at nominal voltage. Similarly, with the bipolar transistor 20 off, a correspondingly small collector current passes through the bipolar transistor 20 corresponding to an amplification of the drain leakage current passing through the MOSFET 22. The beta of MOSFET 22 operating under nominal conditions is expected to between 20 to 30 and the sum of these two leakage currents is anticipated to be less than 30 nano-amps. This low leakage current is advantageous because it is smaller than typical leakage currents associated with the current generation of input protection devices and does not affect the other circuitry operating within the integrated circuit. This characteristic is particularly advantageous in low power and battery operated circuitry.

When a positive ESD pulse appears on the voltage terminal 14 and hence on the emitter 26, this forward biases the emitter-base junction of the bipolar transistor 20 and increases the voltage at the inter-transistor node 24. As the voltage at the voltage terminal 14 increases because of the positive ESD pulse, the voltage at the inter-transistor node 24 increases, but both the bipolar transistor 20 and the MOSFET 22 remain off until the voltage at the inter-transistor node 24 reaches a snapback trigger voltage 38 (FIG. 2B) associated with the MOSFET 22. When the snapback trigger voltage 38 is reached, current begins to flow from the voltage terminal 14, through the emitter-base junction of the bipolar transistor 20, through the inter-transistor node 24, through the MOSFET 22, and to the ground terminal 16. As the increased current flows through the above-identified path, the base 28 of bipolar transistor 20 substantially amplifies the increased current flow through the inter-transistor node 24 and substantially increases the flow of current from the voltage terminal 14, through the bipolar transistor 20 and to the ground terminal 16. A substantial majority of the ESD charge flows through the bipolar transistor 20, rather than the MOSFET 22, thereby preventing the MOSFET 22 from reaching the high joule heating condition and thereby allows for the implementation of the input and power protection circuit 12 in a CMOS fabrication process that employs salicides. Typically, the ratio of current flow through the bipolar transistor 20 compared to that flowing through the MOSFET 22 during a positive ESD pulse can reach as high as approximately 30:1.

Similarly, when a negative ESD pulse appears on the ground terminal 16 and hence on the collector 30, this forward biases the collector-base junction of the bipolar transistor 20, forward biases the diode 18, and allows current to flow to the voltage terminal 14. The voltage required to forward bias the diode 18, the emitter-base junction of the bipolar transistor 20, and the collector-base junction of the bipolar transistor 20 being approximately 0.7 volts. A majority of the current will flow from the ground terminal 16, through the forward biased collector-base junction of the bipolar transistor 20, through the diode 18, and to the voltage terminal 14. However, a minority of the current will flow from the ground terminal 16 through the forward biased collector-base junction of the bipolar transistor 20, through the reverse biased base-emitter junction of the bipolar transistor 20, and to the voltage terminal 14.

Referring now to FIG. 2B, when the positive ESD pulse discussed above appears on the voltage terminal 14, the current through the input and power protection circuit 12 is minimal, except for the slight leakage current discussed above, until the snapback trigger voltage 38 associated with the MOSFET 22 is reached. Thereafter, the current through the input and power protection circuit 12 increases while the voltage between the input protection device 12 drops until a snapback holding voltage 40 associated with the MOSFET 22 is reached. At this point, the current and voltage associated with the input and power protection circuit 12 increases linearly and the slope 42 of this linear increase is inversely proportional to a snapback resistance, discussed below, associated with the MOSFET 22. Presently, the snapback trigger voltage 38, the snapback holding voltage 40, and the snapback resistance associated with the MOSFET 22 is between 5 to 15 volts, between 5 to 7 volts and between 2.0 to 3.0 ohms, respectively, but is anticipated to be in the range of between 1 volt to 25 volts, between 1 volt to 25 volts, and between 1.0 to 3.0 ohms, respectively, in the future. Similarly, when the negative ESD pulse discussed above appears on the ground terminal 16, the current through the input and power protection circuit 12 is minimal, except for the slight leakage current discussed above, until a clamping voltage 44 of approximately −1.4 volts is reached. The clamping voltage is the voltage required to forward bias both the collector-base junction of the bipolar transistor 20 and the diode 18 (2×0.7 volts=−1.4 volts). Thereafter, the slope 46 of the current and voltage associated with the input and power protection circuit 12 increases almost exponentially. Thus, the input and power protection circuit 12 completely safeguards circuitry connected to the voltage terminal 14 and the ground terminal 16 by providing a discharge path for charge whenever any of the terminals is subjected to an overvoltage or ESD pulse in either the positive or negative direction.

A top view and a cross sectional view of each element comprising the input and power protection circuit 12 is illustrated in FIGS. 3, 4, and 5. As illustrated in FIGS. 3, 4, and 5, each element which make up the input and power protection circuit 12 is fabricated in a standard CMOS fabrication process in which the standard channel length is 0.35 microns. Further, this standard CMOS fabrication process uses salicides for ohmic contact to all polysilicon and diffusion regions in FIGS. 3, 4, and 5. The typical noble and refractory metal used to form the approximately 0.1 micron thick salicide layer on all polysilicon and diffusion regions includes both cobalt and titanium. For a general discussion of salicides and techniques for standard CMOS fabrication processing, please refer to the book by Richard C. Jaeger entitled "Introduction to Microelectronic Fabrication, Volume 5, Modular Series on Solid State Devices," Addison-Wesley Publishing Company, May 1993, pages 1–12, 133–150, and 173–196, (ISBN 0-20114695-9) which is hereby incorporated by reference.

Unless otherwise noted in FIGS. 3, 4, and 5, each p+ region has a dopant concentration of approximately $5 \times 10^{19}$ atoms/cm$^3$, each n+ region has a dopant concentration of approximately $1 \times 10^{20}$ atoms/cm$^3$, and each field oxide region extends about 0.5 micrometers into the substrate and extends approximately 0.2 micrometers above the surface of the substrate. Further, note that the voltage terminal 14 (FIG. 2A) is referred to as VDD, the ground terminal 16 (FIG. 2A) as $V_{SS}$, and the inter-transistor node 24 (FIG. 2A) as A in FIGS. 3, 4, and 5.

Referring now to FIG. 3A and 3B, a top view and a cross sectional side view of the MOSFET 22 implemented in silicon is shown. The MOSFET 22 is fabricated in a p-type semiconductor substrate 48. A connection region 50 electrically connects the semiconductor substrate 48 to the voltage level of the ground terminal 16 and corresponds to the substrate terminal 36 (FIG. 2A). A field oxide region 52 is disposed in the semiconductor substrate 48 and electrically isolates the MOSFET 22 from all the other circuitry contained in the semiconductor substrate 48. The MOSFET 22 includes a plurality of mini MOSFETs 54 and each mini MOSFET 56 includes a gate finger 58, a gate oxide layer 72 disposed beneath the gate finger, a source region 62 adjacent to the gate finger, and a drain region 60 adjacent to the gate finger. A snapback trigger voltage, a snapback holding voltage, and a snapback resistance are associated with each mini MOSFET 56. Further, the smallest snapback trigger voltage, in magnitude, of all of the mini MOSFETs 54 will define the snapback trigger voltage for the entire MOSFET 22. Specifically, when a positive ESD pulse appears on the inter-transistor node 24 and hence on the drain regions 60 of each mini MOSFETs 54, all the mini MOSFETs 54 remain off until the smallest snapback trigger voltage is reached. When the smallest snapback trigger voltage is reached, the mini MOSFET 56 associated with this snapback trigger voltage is turned "on" before words while all the remaining mini MOSFETs 56 remain "off." Hence, the snapback holding voltage and the snapback resistance of the mini MOSFET 56 that is turned "on" will also define the snapback holding voltage and the snapback resistance for the entire MOSFET 22.

Referring now to FIG. 3C, a close up side view of the mini MOSFET 56 is shown. An approximately 0.1 micron thick salicide layer 68 and 70 are grown within and along the top surface of the source region 60 and the drain region 62, respectively, of the mini MOSFET 56. A gate oxide layer 72 is grown on the top surface of the semiconductor substrate 48 between the source and drain regions. A polysilicon gate 74 is grown within the top surface of the gate oxide layer 72 and along the top surface of the polysilicon gate 74 is an approximately 0.1 micron salicide layer 76. A first and second side wall spacer 78 and 80, respectively, are formed along the outer edges of the polysilicon gate 74 and the salicide layer 76 and on the top surface of the gate oxide layer 72. A first and second lightly doped drain region 84 and 86, respectively, are formed along the top surface of the semiconductor substrate 48, beneath the gate oxide layer 72, and adjacent to the source region 60 and the drain region 62, respectively. A low temperature oxide layer 88 is disposed over the entire mini MOSFET 56. A first dielectric layer 90, typically glass, is then disposed over the mini MOSFET 56, planarized, and then vias 92 are etched within the dielectric layer 90 all the way to the salicide layers 68 and 70. A first titanium and titanium nitride layer 94 is disposed along the walls of the vias 92 and onto the salicide layers 68 and 70 while a tungsten plug 96 is disposed within the inner walls of the first titanium and titanium nitride layer 94. A second titanium and titanium nitride layer 98 is disposed over the planarized top surface of the dielectric layer 90 and the planarized top surface of the vias 92. An aluminum layer 100 is disposed on the top surface of the second titanium and titanium nitride layer 98, a third titanium and titanium nitride layer 102 is disposed over the aluminum layer 100, and a second dielectric layer 104 is formed over the third titanium and titanium nitride layer 102. Five metalization layers can be employed in this CMOS fabrication process, but the above illustrates both the MOSFET structure and the use of salicide in this CMOS process for the fabrication of the input protection device 12.

An advantageous characteristic of the present invention is that the value of the snapback trigger voltage 38 and the snapback resistance which defines the slope 42 of the linear increase in FIG. 2B are determined by certain dimensions of the mini MOSFETs 56. Referring now to FIG. 3C and assuming that current (1) flows in the direction indicated, the magnitude of the snapback trigger voltage 38 is dependent on the distance from the edge of the gate region to the edge of the tungsten plug. As shown in FIG. 3C, this distance is indicated as $D_{SBV}$. More specifically, the smaller the distance $D_{SBV}$, the smaller the magnitude of the snapback trigger voltage 38. Hence, by controlling the distance $D_{SBV}$ for each mini MOSFET, the magnitude of the snapback trigger voltage 38 for the entire MOSFET 22 can be controlled. Similarly, the magnitude of the snapback resistance is dependent on the length of the gate region. As shown in FIG. 3C, this distance is indicated as $D_{SBR}$. More specifically, the shorter the distance $D_{SBR}$, the smaller the magnitude of the snapback resistance which defines the slope 42 of the linear increase shown in FIG. 2B. Hence, by controlling the distance $D_{SBR}$ for each mini MOSFET, the magnitude of the snapback resistance for the entire MOSFET 22 can be controlled. Accordingly, the input and power protection circuit 12 can be customized to turn on at any magnitude of voltage within a wide range of voltage levels. Further, the input and power protection circuit 12 can also be customized to safely dissipate any magnitude of current within a wide range of currents when the input and power protection circuit 12 is turned on. This feature is particularly advantageous in the application specific integrated circuit industry where there are a numerous different magnitudes of voltages and currents used within numerous different circuit designs.

Referring now to FIGS. 4A and 4B, a top view and a cross sectional side view of the bipolar transistor 20 implemented in silicon is shown. The bipolar transistor 20 shown in FIGS. 4A and 4B is known as a lateral bipolar transistor and is implemented in a standard CMOS fabrication process that employs salicides. The lateral bipolar transistor has several advantageous characteristics including a very low leakage current, a lateral (horizontal, as shown, in FIGS. 4A and 4B) current flow between the base, emitter, and collector, and a high threshold voltage. Two different geometries exist for the lateral bipolar transistor. The first geometry is known as the concentrical bipolar transistor and this geometry is shown in FIGS. 4A and 4B. The concentrical bipolar transistor has a base region between the emitter region and the collector region to maximize current gain, has a uniform distribution of heat throughout the configuration, and is most useful for high power applications. A second geometry is known as the interdigitized bipolar transistor and this geometry is shown in FIGS. 7–25 and 7–26 and discussed on pages 272–276 of Solid State Electronic Devices, Fourth Edition, by Ben G. Streetman (ISBN: 0-13-158767-6) which is hereby incorporated by reference. The interdigitized bipolar transistor has a very low resistance which makes this geometry very useful in communication applications. Both geometries can be used as the lateral bipolar transistor in the input and power protection circuits of the current invention.

Referring now to FIGS. 4A and 4B, the lateral bipolar transistor 20 shown is a concentrical bipolar transistor, partially fabricated in a n-well 106 that has a doping concentration of approximately $10^{17}$ atoms/cm$^3$. The n-well 106 and the lateral bipolar transistor 20 being disposed within the semiconductor substrate 48. The collector region 30 is a p+ region formed within the p region of the semiconductor substrate 48 and the collector region 30 can be separated from the emitter and the collector regions by the field oxide region 52. Disposed within the n well 106, the base region 28 (FIG. 2A) is comprised of a first base region 108 and a second base region 110. Both the first base region 108 and the second base region 110 are disposed adjacent to the emitter region 26 and the first base region 108 is disposed adjacent to the field oxide region 52. A gate oxide layer 72 is disposed between the emitter region and both the first and second base regions which thereby separates the emitter region, the first base region, and the second base region. All the transistors shown in FIGS. 4A and 4B are MOSFETs that have a structure similar to the one shown in detail in FIG. 3C.

Referring now to FIG. 5A and 5B, a top view and a cross sectional side view of the diode 18 implemented in silicon is shown. The diode 18 shown in FIGS. 5A and 5B is of a concentrical geometry. A connection region 112 electrically connects the semiconductor substrate 48 to the voltage level of the ground terminal 16. As shown in FIG. 5B, the connection region 112 is a p+ region implanted within the semiconductor substrate 48. A field oxide region 52 is disposed in the semiconductor substrate 48 and electrically isolates the diode 18 from all the other circuitry contained in the semiconductor substrate 48. Disposed within a n well 106, the diode 18 includes a first anode region 114, a second anode region 116, and a cathode region 118. An oxide region 120 separates and isolates the first anode region 114 from the cathode region 118 and the cathode region 118 from the second anode region 114.

A second preferred embodiment of the novel input and power protection circuit is shown in FIG. 6A where like elements have like numerals to those shown in FIG. 2A and those like elements that have been discussed above will not be discussed further here. The second preferred embodiment of the input and power protection circuit 122 is similar to the first preferred embodiment of the input and power protection circuit 12, except that the diode 18 (FIG. 2A) has been replaced by a MOSFET 124 (FIG. 6A). The MOSFET 124 includes a drain 126 connected to the inter-transistor node 24, a gate 128 connected to the voltage terminal 14, a source 130 connected to the inter-transistor node 24, and a substrate terminal 132 connected to the ground terminal 16. As shown in FIG. 6A, the MOSFET 124 is a P-type MOSFET. The MOSFET 124 is fabricated such that the snapback trigger voltage and the snapback holding voltage associated with the MOSFET 124 is lower in magnitude than the negative nominal operating voltage associated with voltage terminal 14.

The second embodiment of the input and power protection circuit 122 responds to positive ESD pulses in the same manner as the first preferred embodiment of the input and power protection circuit 12 which was discussed above and hence will not be further discussed. However, when a negative ESD pulse appears on the ground terminal 16 and hence on the collector 30, this forward biases the collector-base junction of the bipolar transistor 20 and increases the voltage at the inter-transistor node 24. As the voltage at the ground terminal 16 increases because of the negative ESD pulse, the voltage at the inter-transistor node 24 increases, but the MOSFET 124 remain off until the voltage at the inter-transistor node 24 reaches a snapback trigger voltage 134 (FIG. 6B) associated with the MOSFET 124. When the snapback trigger voltage 134 is reached, current begins to flow from the ground terminal 16, through the collector-base junction of the bipolar transistor 20, through the inter-transistor node 24, through the MOSFET 124, and to the voltage terminal 14. A majority of the current will flow from the ground terminal 16, through the forward biased collector-base junction of the bipolar transistor 20, through the MOSFET 124, and to the voltage terminal 14. However, a minority of the current will flow from the ground terminal 16, through the forward biased collector-base junction of the bipolar transistor 20, through the reverse biased base-emitter junction of the bipolar transistor 20, and to the voltage terminal 14.

Referring now to FIG. 6B, when the positive ESD pulse appears on the voltage terminal 14, the current and voltage characteristic of the input and power protection circuit 122 is similar to that of the input and power protection circuit 12 and will not be discussed further here. However, when the negative ESD pulse appears on the ground terminal 16, the current through the input and power protection circuit 122 is minimal until the snapback trigger voltage 134 associated with the MOSFET 124 is reached. Thereafter, the current through the input and power protection circuit 122 increases while the voltage between the input and power protection circuit 122 drops until a snapback holding voltage 136 associated with the MOSFET 124 is reached. At this point, the current and voltage associated with the input and power protection circuit 122 increases linearly and the slope 138 of this linear increase is inversely proportional to the snapback resistance associated with the MOSFET 124. Presently, the snapback trigger voltage 134, the snapback holding voltage 136, and the snapback resistance associated with the MOSFET 124 is between −5 to −15 volts, between −5 to −7 volts and between −2.0 to −3.0 ohms, respectively, but is anticipated to be in the range of between −1 volt to −25 volts, between −1 volt to −25 volts, and between −1.0 to −3.0 ohms, respectively, in the future. Thus, the input and power protection circuit 122 completely safeguards circuitry connected to the voltage terminal 14 and the ground terminal 16 by providing a discharge path for charge whenever any of the terminals is subjected to an overvoltage or ESD pulse in either the positive or negative direction.

Additional voltage terminals can be added to those already shown in FIGS. 2A and 6A and protected from both ESD pulses and overvoltage conditions by adding an additional input and power protection circuit for each additional terminal. Each input and power protection circuit has a snapback trigger voltage, snapback holding voltage, and snapback resistance that can be tailored to the voltage associated with the additional terminal by varying either $D_{SBV}$ or $D_{SBR}$ in the appropriate MOSFET.

Other device families can also be used to implement the input and power protection circuit according to the present invention. For example, HEMTs, MESFETs, MISFETs, hetrojunction FETs, and hetrojunction bipolar transistors could be used for the bipolar transistor, the MOSFET, the diode, or any combination of the bipolar transistor, the MOSFET, or the diode.

While the invention has been described with respect to the presently preferred embodiments, it will be appreciated by those skilled in the art that modifications and changes can be made to the circuit of the present invention without departing from its spirit or essential characteristics. Accordingly, all modifications or changes which come within the meaning and range of equivalency of the claims are to be embraced within their scope.

What is claimed is:

1. An input and power protection circuit for protecting an integrated circuit from an overvoltage, the input and power protection circuit comprising:

a first terminal and a second terminal;

an electrical element connected between the first terminal and an inter-transistor node;

a first transistor connected between the inter-transistor node and the second terminal, the first transistor having a gate terminal, a drain terminal, and a source terminal, where each of the gate terminal, the drain terminal, and the source terminal have salicided contacts for providing low resistance contact to the first transistor and which also reduce a snap-back trigger current that can be conducted through the first transistor without causing a high joule heating condition in the first transistor, the gate terminal connected to the second terminal, the drain terminal connected to the inter-transistor node, and the source terminal connected to the second terminal, and a bipolar transistor having a base terminal connected to the inter-transistor node, an emitter terminal connected to the first terminal, and a collector terminal connected to the second terminal, where each of the base terminal, the emitter terminal, and the collector terminal have salicided contacts for providing low resistance contact to the bipolar transistor, the bipolar transistor for conducting a majority of the overvoltage between the first terminal and the second terminal, and thereby preventing the first transistor from reaching the high joule heating condition.

2. The input and power protection circuit of claim 1 wherein the bipolar transistor is a lateral bipolar transistor.

3. The input and power protection circuit of claim 1 wherein the electrical element is selected from the group comprising a diode and a field effect transistor.

4. The input and power protection circuit of claim 1 wherein the first transistor is an n-type MOSFET.

5. The input and power protection circuit of claim 1 wherein the first transistor has a snapback trigger voltage of between 1 volt to 20 volts.

6. The input and power protection circuit of claim 1 wherein the electrical element is a field effect transistor having a snapback trigger voltage of between −1 volt to −20 volts.

* * * * *